(12) United States Patent
Mano et al.

(10) Patent No.: US 11,567,524 B2
(45) Date of Patent: Jan. 31, 2023

(54) SWITCH DEVICE

(71) Applicant: KABUSHIKI KAISHA TOKAI RIKA DENKI SEISAKUSHO, Aichi (JP)

(72) Inventors: Shohei Mano, Aichi (JP); Keiji Minami, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 141 days.

(21) Appl. No.: 17/162,331

(22) Filed: Jan. 29, 2021

(65) Prior Publication Data

US 2021/0240214 A1 Aug. 5, 2021

(30) Foreign Application Priority Data

Feb. 4, 2020 (JP) .................. JP2020-017013

(51) Int. Cl.
| | |
|---|---|
| G05G 1/04 | (2006.01) |
| G05G 5/03 | (2008.04) |
| G05G 5/05 | (2006.01) |
| H01H 21/08 | (2006.01) |
| H01H 21/12 | (2006.01) |
| H01H 21/24 | (2006.01) |
| H01H 89/00 | (2006.01) |
| G05G 9/04 | (2006.01) |

(52) U.S. Cl.
CPC ............. *G05G 1/04* (2013.01); *G05G 5/03* (2013.01); *G05G 5/05* (2013.01); *H01H 21/085* (2013.01); *H01H 21/12* (2013.01); *H01H 21/24* (2013.01); *H01H 89/00* (2013.01); *G05G 9/04* (2013.01); *G05G 2505/00* (2013.01); *H01H 2221/016* (2013.01)

(58) Field of Classification Search
CPC ... H01H 21/085; H01H 21/12; G05G 2505/00
See application file for complete search history.

(56) References Cited

U.S. PATENT DOCUMENTS

2019/0041894 A1* 2/2019 Parazynski ............ G05G 9/047
2019/0180959 A1* 6/2019 Lu .......................... H01H 21/12

FOREIGN PATENT DOCUMENTS

JP 2005-251625 A 9/2005

* cited by examiner

*Primary Examiner* — Vicky A Johnson
(74) *Attorney, Agent, or Firm* — Calderon, Safran & Cole, P.C.

(57) ABSTRACT

A switch device includes an operating knob on which a tilting operation is performed, a detected portion that tilts with the tilting operation of the operating knob, a detection portion that detects movement of the detected portion, and a substrate on which the detection portion is arranged. The detection portion is aligned in an in-plane direction of the substrate and performs a switching operation upon detection of movement of the detected portion in the in-plane direction.

10 Claims, 6 Drawing Sheets

SWITCH DEVICE

CROSS-REFERENCE TO RELATED APPLICATIONS

The present patent application claims the priority of Japanese patent application No. 2020/017013 filed on Feb. 4, 2020, and the entire contents of Japanese patent application No. 2020/017013 are hereby incorporated by reference.

TECHNICAL FIELD

The present invention relates to a switch device.

BACKGROUND ART

A momentary switch device has been proposed which allows, e.g., an operating force and a displacement amount when operating the switch to be freely set to a desired value and barely makes sound during being operated and returning to the original state. In the switch device, a detection switch is mounted on a substrate, and two displacement portions each composed of a base, a top formed of a rubber-based member and a click rubber also formed of a rubber-based member and sandwiched therebetween are provided on a housing and located above the substrate. Then, a switch knob formed of a synthetic resin member and having a substantially squared U-shape is placed from above the housing so as to cover the housing. The switch knob is configured that a rotating shaft protrudes from both side surfaces, openings are formed at the edges of the both side surfaces, and a lever of the detection switch is inserted through the openings. Two protruding portions are further provided on the inner surface of the upper portion of the switch knob and respectively face the tops on the two click rubbers provided on the housing (see, e.g., Patent Literature 1).

CITATION LIST

Patent Literature

Patent Literature 1: JP 2005/251625 A

SUMMARY OF INVENTION

In the switch device of Patent Literature 1, the rotating shaft is provided so as to protrude from the both side surfaces of the switch knob, and the lever of the detection switch is inserted through the openings formed at the edges of the both side surfaces. Therefore, a tilting operation of the switch knob causes rotation of the rotating shaft and movement of the lever of the detection switch with the rotation provides detection of the tilting operation of the switch knob. Devices which detect an operation of the switch knob via the lever of the detection switch in such a manner has a problem that the degree of freedom in arranging the detection switch is limited and it is difficult to reduce the size or thickness of the switch.

It is an object of the invention to provide a switch device which can be reduced in size or thickness while providing a degree of freedom in arranging detection portions.

According to an embodiment of the invention, an switch device comprises:

an operating knob on which a tilting operation is performed;

a detected portion that tilts with the tilting operation of the operating knob;

detection portions that detect movement of the detected portion; and a substrate on which the detection portions are arranged, wherein the detection portions are aligned in an in-plane direction of the substrate and performs a switching operation upon detection of movement of the detected portion in the in-plane direction.

Advantageous Effects of Invention

According to an embodiment of the invention, it is possible to reduce the size or thickness while providing a degree of freedom in arranging detection portions.

DESCRIPTION OF EMBODIMENTS

First Embodiment of the Invention

Figure 1:
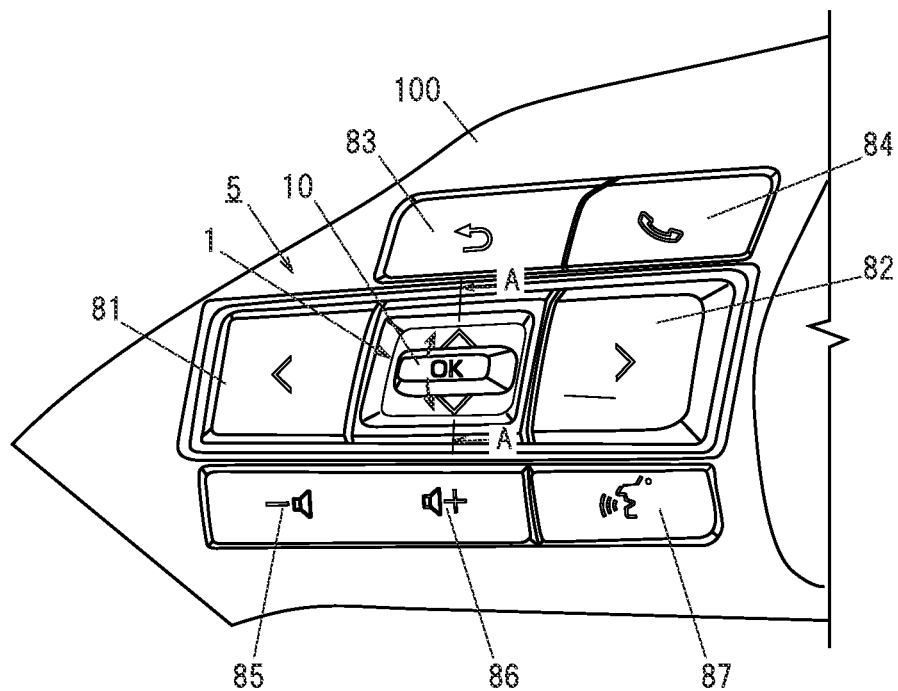
FIG. 1 is a front view showing the position of a knob of a switch device in embodiments of the present invention.
Figure 2:
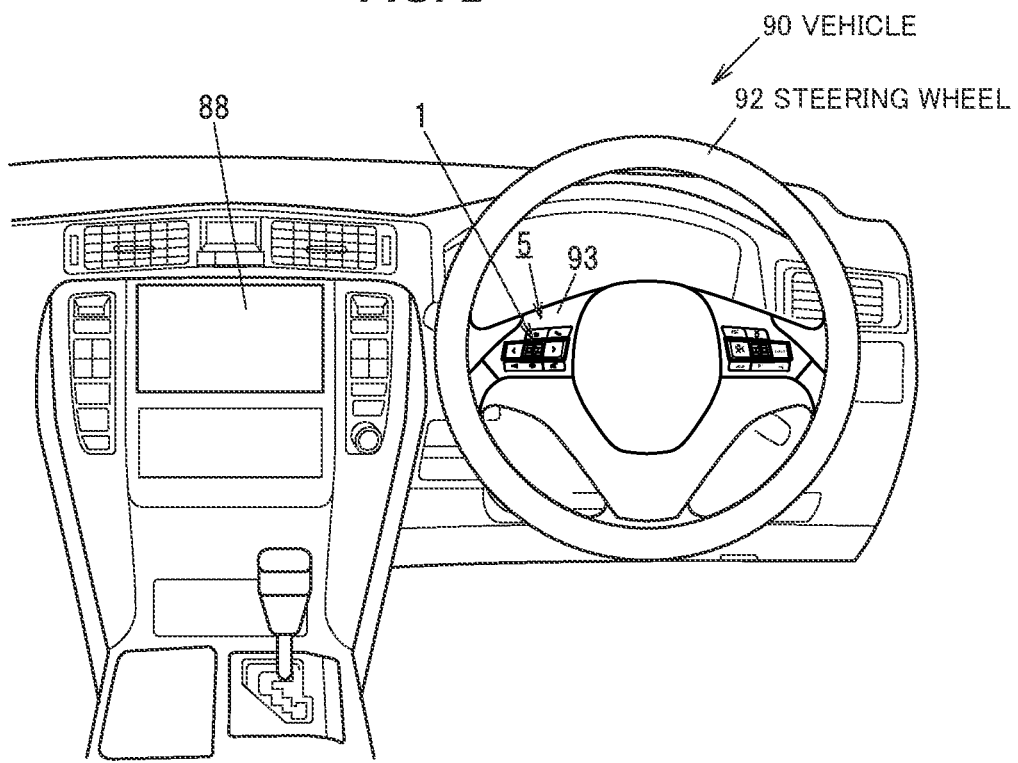
FIG. 2 is a front view showing the vicinity of a steering wheel and a driver's seat of a vehicle to show an example in which the switch device in the embodiments of the invention is installed on the steering wheel of the vehicle.

A switch device 1 in the embodiments of the invention has an operating knob 10 on which a tilting operation is performed, a detected portion 20 that tilts with the tilting operation of the operating knob 10, detection portions 30, 31 that detect movement of the detected portion 20, and a substrate 40 on which the detection portions 30, 31 are arranged, and it is configured that the detection portion 30 is arranged in an in-plane direction of the substrate 40 and performs a switching operation upon detection of movement of the detected portion 20 in the in-plane direction.

The switch device 1 in the first embodiment of the invention is configured that the detected portion 20, which tilts with the tilting operation of the operating knob 10, is integrally formed with the operating knob 10. The detected portion 20 is formed, e.g., integrally with the operating knob 10 by resin molding and formed as a portion of the operating knob 10.

(Operating Knob 10)

The operating knob 10 is tilt-operated by an operator and is configured to allow for detection corresponding to a direction in which the tilting operation is performed. As an usage example, the switch device 1 in the embodiment of the invention is applicable as, e.g., a part of a multiple operation switch 5 as shown in FIG. 1.

As a particular example of application, the multiple operation switch 5 including the switch device 1 is installed on a spoke 93 of a steering wheel 92 of a vehicle 90. The multiple operation switch 5 is configured that, e.g., the operating knob 10 is arranged at the center and can be tilt-operated in a vertical direction. Operations, etc., on the menu can be performed by this tilting operation in the vertical direction, as shown in FIG. 1. Operations, etc., in a horizontal direction can be performed by operating push switches 81, 82.

In FIG. 1, e.g., various selection buttons such as for, e.g., back 85 (a back button), a telephone selecting portion 84, volume down 85, volume up 86 and speech recognition 87 are arranged around the operating knob 10. Operations, etc., on the menu, which is displayed on a display unit 88 by operating these selection buttons, can be performed by tilt-operating the operating knob 10. As an example, when operating to control an air conditioner, temperature on the driver's seat side can be adjusted to raise from the initial setting by tilt-operating the operating knob 10 in an upward direction and to lower by tilt-operating the operating knob 10 in a downward direction.

Figure 3:
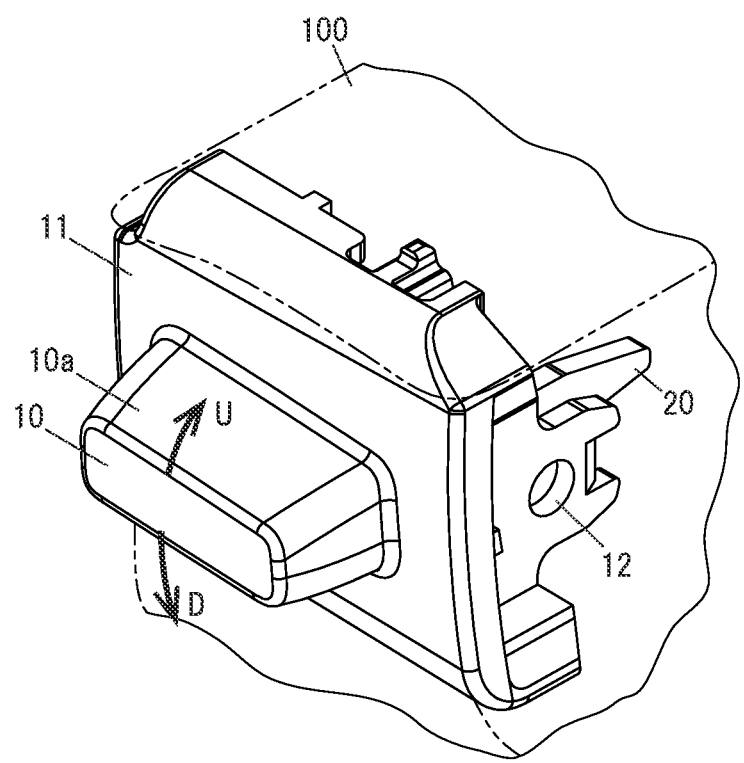
FIG. 3 is a three-dimensional perspective view showing movement of an operating knob of the switch device in the embodiments of the invention when being operated.

As shown in FIG. 3, the operating knob 10 is formed by, e.g., resin molding so that a main body portion 11, an operating portion 10a, a center shaft 12 for tilting movement, and the detected portion 20 are formed integrally. The operating knob 10 is assembled to a main body 100 as a housing and can be tilt-operated in an upward direction U or a downward direction D shown in FIG. 3.

Figure 4A:
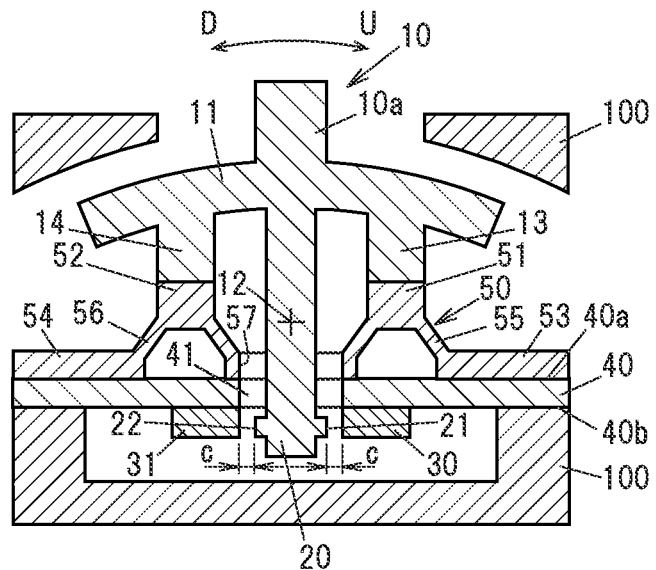
FIG. 4A is a cross sectional view showing the switch device in the first embodiment of the invention when taken along the line A-A of FIG. 1.
Figure 4B:
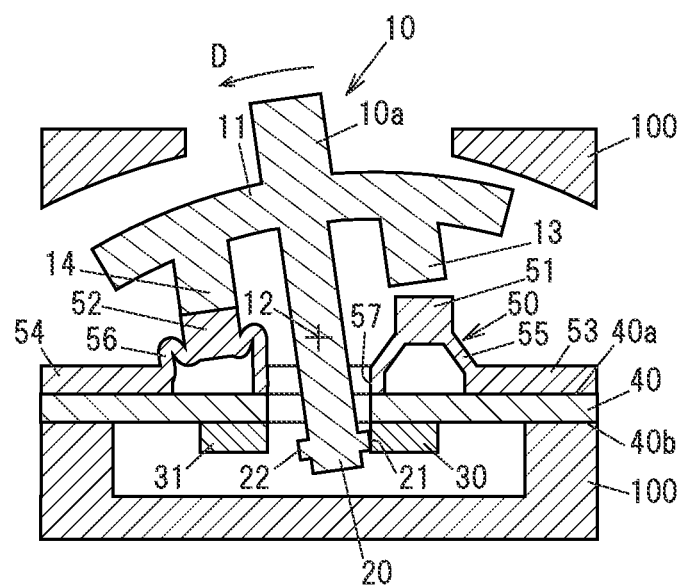
FIG. 4B is a cross sectional view when the operating knob is tilt-operated.

FIG. 4A is a cross sectional view showing the switch device in the first embodiment of the invention when taken along the line A-A of FIG. 1, and FIG. 4B is a cross sectional view when the operating knob is tilt-operated. In FIGS. 4A and 4B, the cross sections taken along the line A-A of FIG. 1 are shown in such a manner that the operating knob 10 is shown on the upper side and the substrate 40 is shown on the lower side.

As shown in FIG. 4A, the operating knob 10 is arranged so that the operating portion 10a is located on a front surface 40a side of the substrate 40. The operating knob 10 is formed so that the operating portion 10a and the detected portion 20 are located opposite to each other with respect to the center shaft 12 for tilting movement. The center shaft 12 of the operating knob 10 is rotatably attached to the main body 100. Thus, as shown in FIG. 4B, when, e.g., the operating portion 10a of the operating knob 10 is tilt-operated in the direction D which is a leftward direction, the detected portion 20 rotationally moves in a rightward direction.

As shown in FIG. 4A, abutment portions 13, 14 butting against a detent (or click) portion 50 are formed on the main body portion 11 of the operating knob 10. The abutment portions 13, 14 can butt against top end portions 51, 52 of a detent portion 50 (described later).

(Detected Portion 20)

The detected portion 20 is integrally formed with the operating knob 10, as described above. The detected portion 20 is formed so as to protrude on a back surface 40b side of the substrate 40.

Detection surfaces 21, 22 of the detected portion 20 are objects to be detected by the detection portions 30, 31 (described later). In case that the detection portions 30, 31 are contact switches, the detection surfaces 21, 22 are formed as abutment surfaces or contact surfaces. Meanwhile, in case that the detection portions 30, 31 are distance sensors, the detection surfaces 21, 22 are formed as light reflecting surfaces when detecting distance, etc., using light and formed as magnetic surfaces with permanent magnets attached thereto when detecting distance, etc., using magnetic detection.

The detection portions 30, 31 in the first embodiment are contact switches, hence, the detection surfaces 21, 22 are formed as abutment surfaces or contact surfaces. The detection surfaces 21, 22 butt against or come into contact with the detection portions 30, 31 in a tilted state as shown in FIG. 4B and thus may be formed as inclined surfaces or curved surfaces.

(Detection Portions 30, 31)

The detection portions 30, 31 are aligned in an in-plane direction of the substrate 40. In other words, the detection portions 30, 31 are arranged and attached at predetermined positions on the front surface or back surface of the substrate 40. The detection portions 30, 31 detect movement of the detected portion 20. In particular, the detection portion 30 is arranged on the back surface 40b of the substrate 40 to detect movement of the detection surfaces 21, 22 of the tilted detected portion 20. Contact switches are used as the detection portions 30, 31 as described above. The contact switches are provided with contact circuits inside the detection portions 30, 31 and perform a switching operation when the contact circuits are opened or closed by an external force acting thereon. Besides the contact switches, it is possible to use tactile switches or limit switches, etc.

(Modification)

As the detection portions 30, 31, it is possible to use non-contact sensors such as distance sensors. For example, photosensors having a photodiode or phototransistor which change output according to light intensity can be used as the detection portions 30, 31. Alternatively, e.g., magnetic sensors which change output according to a magnetic field, such as Hall sensors or MR sensors, can be also used as the detection portions 30, 31.

(Substrate 40)

The substrate 40 is a rigid substrate such as glass epoxy substrate as an example, and has a circuit pattern which is formed on the front surface 40a, the back surface 40b, or both and on which electronic components such as the detection portions 30, 31 are mounted.

In the first embodiment, the detection portions 30, 31 are aligned in the in-plane direction of the substrate 40 on the back surface 40b and attached to predetermined positions, as shown in FIG. 4A. The detection portions 30, 31, which are contact switches, are attached to positions at which the switches are turned on when the detection surfaces 21, 22 of the detected portion 20 moves by a predetermined value c due to the tilting operation of the operating knob 10, as shown in FIG. 4A.

The substrate 40 also has a through-hole 41 formed to allow the detected portion 20 to protrude on the back surface 40b side. The through-hole 41 may be larger than the hole dimension as the initial setting so that the amount of tilt-operating the operating knob 10 can be changed by changing the positions for attaching the detection portions 30, 31.

(Detent Portion 50)

The detent portion 50 is provided on the front surface 40a of the substrate 40 so that the operating knob 10 provides an operational feeling. In the first embodiment, the detent portion 50 is formed as a rubber dome using an elastomer (rubber) such as silicon and integrally has the top end portions 51, 52, side portions 53, 54, and dome portions 55, 56 formed in a raised shape and producing a click feeling by deformation. The detent portion 50 also has a through-hole 57 to allow the detected portion 20 to protrude on the back surface 40b side of the substrate 40.

The dome portions 55, 56 apply an elastic force of the rubber to the operating knob 10 by deformation caused by butting against or coming into contact with the abutment portions 13, 14 of the operating knob 10, and thereby generate a resistance force against the tilting operation and also provide a click feeling to an operator. In this case, it is possible to eliminate contacts, etc., inside the dome portions, allowing for reduction in the diameter of the dome and resulting size reduction.

In addition, the detent portion 50 can cover the entire substrate 40 by having the side portions 53, 54 and this provides a waterproof function to the substrate.

(Control Unit 70)

Figure 5:
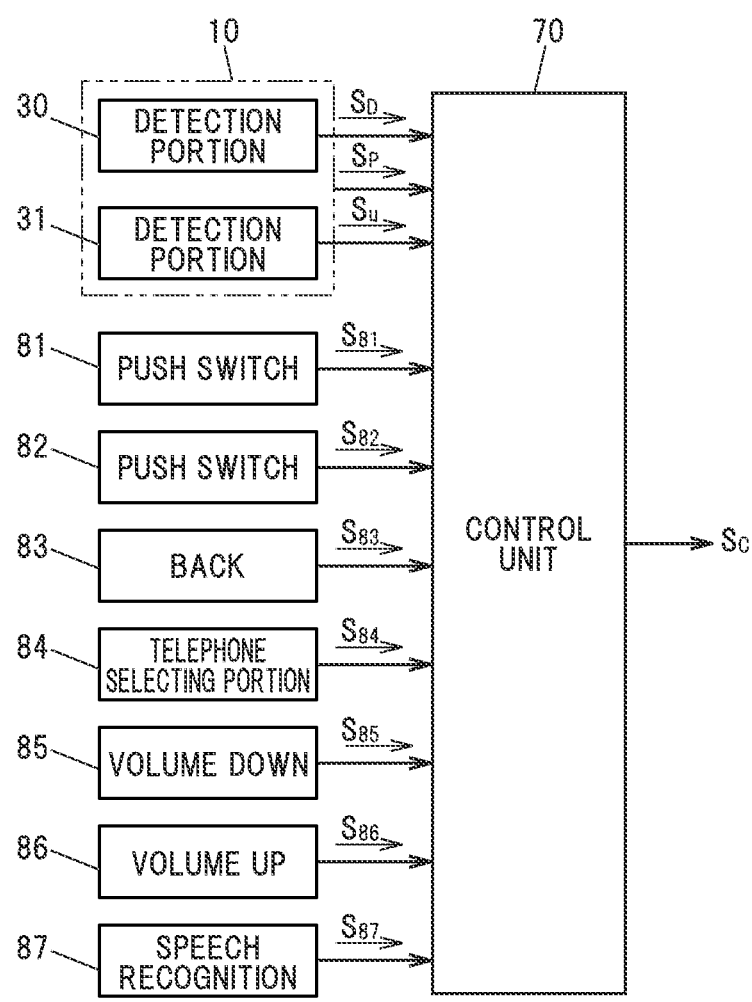
FIG. 5 is a block diagram illustrating a configuration of the switch device in the embodiments of the invention.

FIG. 5 is a block diagram illustrating a configuration of the switch device in the embodiment of the invention. A control unit 70 is, e.g., a microcomputer composed of a CPU (Central Processing Unit) performing calculation and processing, etc., of the acquired data according to a program, and a RAM (Random Access Memory) and a ROM (Read Only Memory) as semiconductor memories, etc. The RAM is used as, e.g., a storage area for temporarily storing calculation results, etc. In addition, the control unit 70 receives signals from various selection buttons shown in FIG. 5 and the detection portions 30, 31, processes the signals according to a predetermined program, and thereby can output a control signal Sc to the vehicle 90.

As shown in FIG. 5, detection signals $S_U$, $S_D$ from the detection portions 30, 31, detection signals $S_{81}$, $S_{82}$ from the push switches 81, 82, a detection signal $S_{83}$ from an air conditioner control selection portion 83, a detection signal $S_{84}$ from the telephone selecting portion 84, a detection signal $S_{85}$ from the volume down 85, a detection signal $S_{86}$ from the volume up 86, and a detection signal $S_{87}$ from the speech recognition 87 are input to the control unit 70. Based on these input signals, the control unit 70 changes, e.g., the menu screen displayed on the display unit 88. It is also possible to control to turn up and down, etc., the setting values by tilt-operating the operating knob 10.

(Operation of the Switch Device 1)

The operating knob 10 is tilt-operated from a non-operated state shown in FIG. 4A by a finger, etc., of an operator. In the first embodiment, the detected portion 20, which tilts with the tilting operation of the operating knob 10, is integrally formed with the operating knob 10. Therefore, the detected portion 20 tilts together with, i.e., integrally with the tilting operation of the operating knob 10.

In the state in which, e.g., the operating knob 10 is tilt-operated in the direction D as shown in FIG. 4B, the detection surface 21 of the detected portion 20 butts against or comes into contact with the detection portion 30. The contact circuit inside the detection portion 30 as a contact switch is thereby turned on and the detection signal $S_D$ shown in FIG. 5 is input to the control unit 70. Likewise, when the operating knob 10 is tilt-operated in the direction U, the detection signal $S_U$ is input to the control unit 70.

(Adjustment of the Tilting Operation Amount)

The tilting operation amount of the operating knob 10 described above depends on distances between the detection portions 30, 31 attached to the substrate 40 and the detection surfaces 21, 22 of the detected portion 20, as shown in FIG. 4A. In the example described above, the distances between the detection portions 30, 31 and the detection surfaces 21, 22 of the detected portion 20 have a predetermined value c as shown in FIG. 4A.

Figure 6:
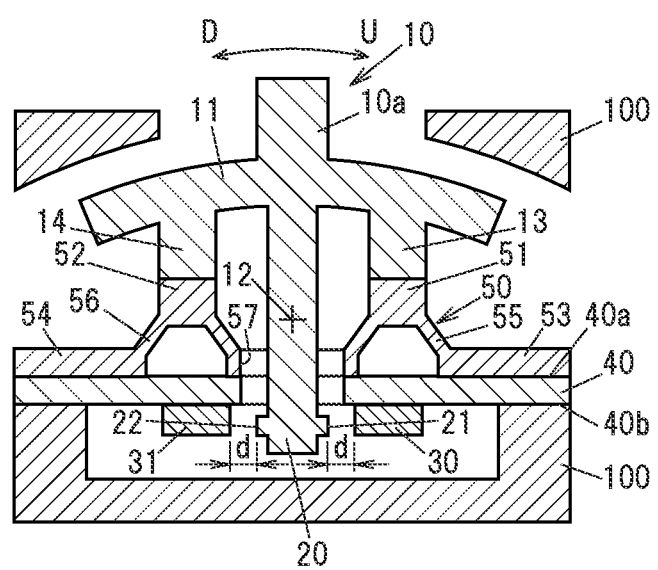
FIG. 6 is a diagram corresponding to FIG. 4A and showing an example wherein the positions of detection portions are changed in an in-plane direction of the substrate as viewed in the cross section taken along the line A-A of FIG. 1 to increase the tilting operation amount of the operating knob.

FIG. 6 is a diagram corresponding to FIG. 4 and showing an example in which the positions of the detection portions are changed in the in-plane direction of the substrate as viewed in the cross section taken along the line A-A of FIG. 1 to increase the tilting operation amount of the operating knob. For example, by aligning the detection portions 30, 31 in the in-plane direction of the substrate 40 so that the distances have a value d which is larger than the value c shown in FIG. 4A, it is possible to easily change to increase the tilting operation amount of the operating knob 10. In this regard, the through-hole 41 of the substrate 40 is formed large in advance as described above, and the through-hole 57 of the detent portion 50 is also correspondingly formed large in advance.

It is also possible to easily change to reduce the tilting operation amount of the operating knob 10 by, e.g., attaching the detection portions 30, 31 to the substrate 40 so that the distances have a smaller value than the value c shown in FIG. 4A.

As such, since the detection portions 30, 31 are aligned in the in-plane direction of the substrate 40 and perform a switching operation upon detection of movement of the detected portion 20 in the in-plane direction, it is easy to change the tilting operation amount of the operating knob 10. In addition, since the switching operation is performed upon detection of the movement of the detected portion 20 in the in-plane direction, the degree of freedom in arranging the detection switches is high and the degree of freedom in designing is also high regardless of the tilting operation amount. This allows for size reduction or thickness reduction of the switch device.

Second Embodiment of the Invention

The switch device 1 in the second embodiment of the invention is configured that the detected portion 20, which tilts with the tilting operation of the operating knob 10, is formed separately from the operating knob 10.

Figure 7A:
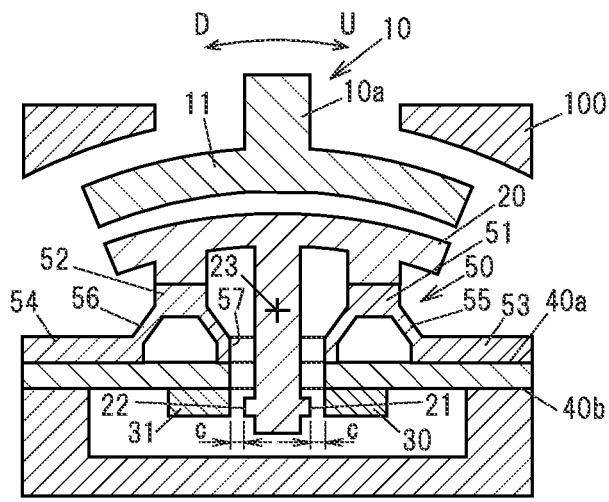
FIG. 7A is a cross sectional view showing the switch device in the second embodiment of the invention when taken along the line A-A of FIG. 1.
Figure 7B:
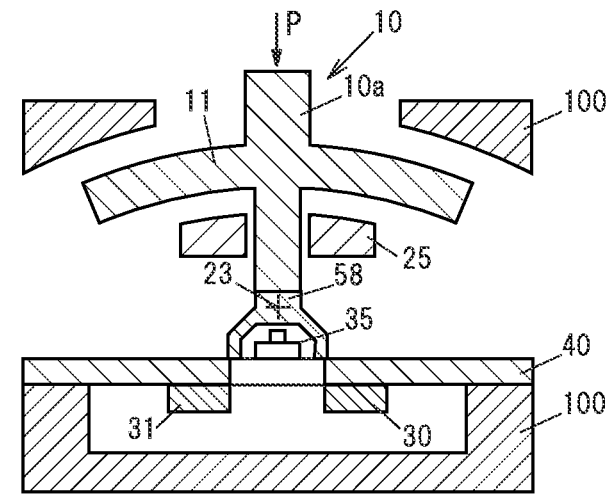
FIG. 7B is a cross sectional view taken at another cross-sectional position at which a guide portion is seen.

As shown in FIG. 7A, the operating knob 10 is slidable in a direction P shown in FIG. 7B due to the presence of a guide portion 25. Slide of the operating knob 10 in the direction P, e.g., a push operation does not apply a force to the detected portion 20.

Meanwhile, as shown in FIG. 7B, the detected portion 20 is configured that a center shaft 23 for tilting movement is rotatably attached to the main body 100. Therefore, the operating knob 10 is coupled to the detected portion 20 in a rotational direction by the guide portion 25, and the operating knob 10 and the detected portion 20 integrally rotate about the center shaft 23.

Such a configuration allows the operating knob 10 to independently move in the direction P. In addition, when the operating knob 10 is tilt-operated, the operating knob 10 and the detected portion 20 integrally tilt about the center shaft 23. The remaining configuration, operation and motion are the same as those in the first embodiment.

(Operation of the Switch Device 1)

When the operating knob 10 is push-operated from a non-operated state shown in FIG. 7A in the direction P by a finger, etc., of an operator, the operating knob 10 moves in the direction P. A detection portion 35 shown in FIG. 7B detects the push operation, and a detection signal Sp shown in FIG. 5 is thereby input to the control unit 70. This detection signal Sp can be used as, e.g., a confirmation signal to confirm selection on the menu screen.

Then, the operating knob 10 is tilt-operated from a non-operated state shown in FIG. 7A by a finger, etc., of the operator. In the second embodiment, the operating knob 10 and the detected portion 20 tilt integrally when the operating knob 10 is tilt-operated, as described above.

Figure 7C:
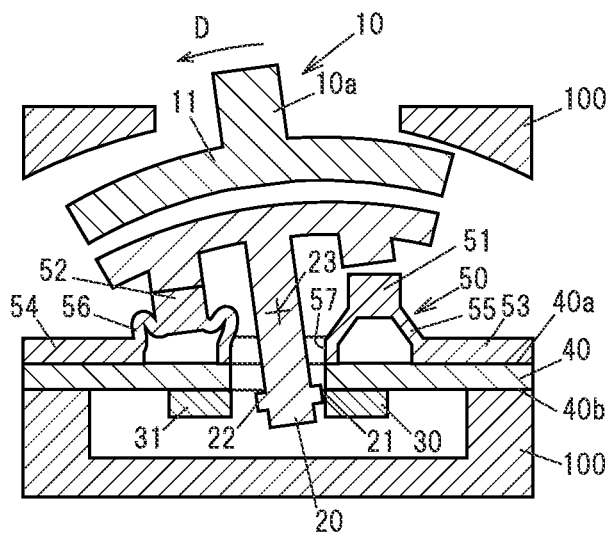
FIG. 7C is a cross sectional view when the operating knob is tilt-operated as viewed in the cross section taken along the line A-A.

In the state in which, e.g., the operating knob 10 is tilt-operated in the direction D as shown in FIG. 7C, the detection surface 21 of the detected portion 20 butts against or comes into contact with the detection portion 30. The contact circuit inside the detection portion 30 as a contact switch is thereby turned on and the detection signal $S_D$ shown in FIG. 5 is input to the control unit 70. Likewise, when the operating knob 10 is tilt-operated in the direction U, the detection signal $S_U$ is input to the control unit 70.

Effects of the embodiments of the invention

The embodiments of the invention exert the following effects.

(1) The switch device 1 in the embodiments of the invention has the operating knob 10 on which a tilting operation is performed, the detected portion 20 that tilts with the tilting operation of the operating knob 20, the detection portions 30, 31 that detect movement of the detected portion 20, and the substrate 40 on which the detection portions 30, 31 are arranged, and it is configured that the detection portion 30 is arranged in the in-plane direction of the substrate 40 and performs a switching operation upon detection of movement of the detected portion 20 in the in-plane direction. Since it is configured that the detection portions 30, 31 are arranged on the back surface 40b of the substrate 40, it is possible to reduce the size on the front side of the substrate and thereby reduce height/thickness of the switch.

(2) Since the detection portions 30, 31 are aligned in the in-plane direction of the substrate 40 and performs a switching operation upon detection of movement of the detected portion 20 in the in-plane direction, it is easy to change the tilting operation amount of the operating knob 10. As a result, mis-operation can be prevented by adjusting an operation stroke depending on the positions of the detection switches.

(3) In the second embodiment, it is possible to perform a tilting operation as well as a push operation on the operating knob 10 and it is thus possible to expand functions of the operating knob 10.

The invention is not limited to the embodiments described above and various kinds of modifications can be implemented without departing from or changing the technical idea of the invention. Although the representative embodiments of the invention and the illustrated examples have been described, the invention according to claims is not to be limited to the above-mentioned embodiments and illustrated examples. Therefore, please note that all combinations of the features described in the embodiments and illustrated examples are not necessary to solve the problem of the invention.

REFERENCE SIGNS LIST

1 SWITCH DEVICE
10 OPERATING KNOB
5 MULTIPLE OPERATION SWITCH
10 OPERATING KNOB
10a OPERATING PORTION
11 MAIN BODY PORTION
12 CENTER SHAFT
13, 14 ABUTMENT PORTION
15 GUIDE PORTION
20 DETECTED PORTION
21, 22 DETECTION SURFACE
23 CENTER SHAFT
25 GUIDE PORTION
30, 31 DETECTION PORTION
35 DETECTION PORTION
40 SUBSTRATE
40a FRONT SURFACE
40b BACK SURFACE
41 THROUGH-HOLE
50 DETENT PORTION
51, 52 TOP END PORTION
53, 54 SIDE PORTION
55, 56 DOME PORTION
57 THROUGH-HOLE
70 CONTROL UNIT
81, 82 PUSH SWITCH
83 BACK
84 TELEPHONE SELECTING PORTION
85 VOLUME DOWN
86 VOLUME UP
87 SPEECH RECOGNITION
88 DISPLAY UNIT
90 VEHICLE
92 STEERING WHEEL
93 SPOKE
100 MAIN BODY

The invention claimed is:

1. A switch device, comprising:
an operating knob on which a tilting operation is performed;
a detected portion that tilts with the tilting operation of the operating knob;
a detection portion that detects movement of the detected portion; and
a substrate on which the detection portion is arranged,
wherein the detection portion is aligned in an in-plane direction of the substrate and performs a switching operation upon detection of movement of the detected portion in the in-plane direction, and
wherein the operating knob is arranged on a front surface side of the substrate, and the detection portion is arranged on a back surface side of the substrate.

2. The switch device according to claim 1, wherein the detected portion protrudes on a back surface side of the substrate.

3. The switch device according to claim 1, wherein a detent portion is provided on the front surface of the substrate so that the operating knob provides an operational feeling.

4. The switch device according to claim 1, wherein the detected portion is integrally formed with the operating knob.

5. The switch device according to claim 1, wherein the detected portion is formed separately from the operating knob.

6. The switch device according to claim 1, wherein a detent portion covers an entirety of the substrate to provide a waterproof function to the substrate.

7. The switch device according to claim 6, wherein the detent portion comprises a through-hole to allow the detected portion to protrude on a back surface side of the substrate.

8. The switch device according to claim 6, wherein the substrate comprises a through-hole to allow the detected portion to protrude on a back surface side of the substrate.

9. A switch device, comprising:
   an operating knob on which a tilting operation is performed;
   a detected portion that tilts with the tilting operation of the operating knob;
   a detection portion that detects movement of the detected portion; and
   a substrate on which the detection portion is arranged,
   wherein the detection portion is aligned in an in-plane direction of the substrate and performs a switching operation upon detection of movement of the detected portion in the in-plane direction, and
   wherein the detected portion protrudes on a back surface side of the substrate.

10. A switch device, comprising:
    an operating knob on which a tilting operation is performed;
    a detected portion that tilts with the tilting operation of the operating knob;
    a detection portion that detects movement of the detected portion; and
    a substrate on which the detection portion is arranged,
    wherein a detent portion is provided on the front surface of the substrate so that the operating knob provides an operational feeling,
    wherein the detection portion is aligned in an in-plane direction of the substrate and performs a switching operation upon detection of movement of the detected portion in the in-plane direction, and
    wherein the detent portion covers an entirety of the substrate to provide a waterproof function to the substrate.

* * * * *